United States Patent [19]
Todd et al.

[11] Patent Number: 5,622,747
[45] Date of Patent: Apr. 22, 1997

[54] METHOD FOR DISPENSING A LAYER OF PHOTORESIST ON A WAFER WITHOUT SPINNING THE WAFER

[75] Inventors: Charles N. Todd, Idaho Falls, Id.; Frederick Dyson, Bluffdale, Utah

[73] Assignee: National Semiconductor Corporation, Santa Clara, Calif.

[21] Appl. No.: 464,434

[22] Filed: Jun. 5, 1995

Related U.S. Application Data

[62] Division of Ser. No. 196,873, Feb. 14, 1994, which is a continuation of Ser. No. 761,605, Sep. 18, 1991, abandoned.

[51] Int. Cl.$^6$ ................................................. B05D 5/12
[52] U.S. Cl. ................... 427/96; 427/294; 118/410; 118/679
[58] Field of Search ............................ 118/407, 415, 118/410, 679, 680, 686, 687, 674, 692; 427/96, 294, 420

[56] References Cited

U.S. PATENT DOCUMENTS

| | | | |
|---|---|---|---|
| 3,707,944 | 1/1973 | Grundon et al. | 118/50 |
| 3,811,405 | 5/1974 | Baker et al. | 118/2 |
| 3,961,599 | 6/1976 | Jones, Jr. | 118/6 |
| 4,225,638 | 9/1980 | Waugh | 427/331 |
| 4,281,057 | 7/1981 | Castellani et al. | 430/270 |
| 4,291,642 | 9/1981 | Kole | 118/415 |
| 4,431,690 | 2/1984 | Matt et al. | 427/424 |
| 4,622,239 | 11/1986 | Schoenthaler et al. | 427/96 |
| 4,640,846 | 2/1987 | Kuo . | |
| 4,692,351 | 9/1987 | Maeda et al. | 427/196 |
| 4,708,629 | 11/1987 | Kasamatsu | 425/466 |
| 4,738,910 | 4/1988 | Ito et al. | 430/30 |
| 4,744,330 | 5/1988 | Claassen | 118/410 |
| 4,794,021 | 12/1988 | Potter | 427/240 |
| 4,822,647 | 4/1989 | Nozaki et al. | 427/421 |
| 4,833,748 | 5/1989 | Zimmer et al. | 8/151 |
| 4,922,852 | 5/1990 | Price | 118/683 |
| 4,938,994 | 7/1990 | Choinski | 427/96 |
| 4,941,428 | 7/1990 | Engel | 118/680 |
| 4,987,854 | 1/1991 | Hall | 118/679 |

FOREIGN PATENT DOCUMENTS

| | | |
|---|---|---|
| 63-99527 | 4/1988 | Japan . |
| 2045463 | 10/1980 | United Kingdom . |
| 2138178 | 10/1984 | United Kingdom . |

*Primary Examiner*—Katherine Bareford
*Attorney, Agent, or Firm*—Skjerven, Morrill, MacPherson, Franklin & Friel; Paul J. Winters; Arthur J. Behiel

[57] ABSTRACT

A photoresist dispensing apparatus coats a wafer with potoresist to define a layer having substantially uniform thickness. The apparatus receives photoresist into a reservoir. The photoresist flows from the reservoir to a substantially planar channel formed between parallel plates. The photoresist flows between the plates towards an elongated straight-edge exit opening. The surface tension and the viscous forces of the photoresist causes a bead to form at the exit opening. By passing a wafer beneath the dispenser apparatus at the exit opening so as to contact the bead, the surface tension is broken. As a result, the photoresist flows onto the wafer. The wafer is moved under the dispenser on tracks which maintain the wafer substantially level. The pressure from the photoresist in the reservoir maintains a steady flow of photoresist as the wafer passes below the dispenser. Accordingly, a substantially uniform layer of photoresist is applied. Photoresist layers as thin as 20 microns have been achieved. To achieve layers of one micron thickness, a wafer receiving a uniform coating as described above is spun to reduce excess photoresist. As a result, the amount of photoresist applied to a wafer to obtain a one micron layer is substantially reduced. By applying a layer having substantially uniform thickness prior to spinning, streaking and cobweb effects are eliminated.

6 Claims, 3 Drawing Sheets

METHOD FOR DISPENSING A LAYER OF PHOTORESIST ON A WAFER WITHOUT SPINNING THE WAFER

This application is a division of application Ser. No. 08/196,873, filed Feb. 14, 1994, which is a continuation of Ser. No. 07/761,605, filed Sep. 18, 1991 now abandoned.

BACKGROUND OF THE INVENTION

This invention is related to a method and apparatus for dispensing photoresist onto a semiconductor wafer. More particularly, this invention relates to a method and apparatus for minimizing the amount of photoresist needed to form a photoresist layer of uniform thickness.

Conventional approaches for forming a layer of photoresist on a wafer involve flooding the center of the wafer with photoresist, then spinning the wafer. Spinning causes the photoresist to spread radially over the wafer, with excess photoresist being spun off. However, spinning typically causes the photoresist to be thicker at the wafer edges.

During spinning, surface tension forces hold photoresist to the wafer edge. The result is a buildup of photoresist around the edge of the wafer. To reduce such buildup a solvent often is squirted onto the bottom of the wafer during the spinning. The spinning forces the solvent to an underlying edge where photoresist is contacted, pulling some of the photoresist over the edge. The solvent, however, has not been found to leave a uniform coating of photoresist. Accordingly, a method for providing a more uniform thickness throughout the wafer surface is needed.

Another problem with the conventional spinning method is that approximately 99.5% of the photoresist applied to the wafer is spun off the wafer as waste. The excessive amounts of photoresist have been necessary, however, to prevent substantially non-uniform coatings. Reducing the amount of photoresist has been found to cause streaking or a "cobweb" effect. To avoid streaking and "cobwebs" conventional spinning methods use approximately 200 times the amount of photoresist required for the final photoresist layer. Accordingly, a more efficient method and apparatus for forming a uniform photoresist layer is needed.

SUMMARY OF THE INVENTION

According to the invention, a substantially uniform layer of photoresist is applied to a wafer with a dispenser which defines an elongated bead spanning the diameter of the wafer. The bead remains intact at the dispenser due to surface tension and viscous forces of the photoresist. As the wafer moves relative to the dispenser making contact with the bead, surface tension is broken causing the photoresist to flow onto the wafer.

According to one aspect of the invention, the dispenser defines an entry opening, a reservoir and a planar channel having a straight-edge exit opening. The exit opening has a length exceeding the diameter of a wafer and a narrow inner wall width. The width is predefined as are photoresist pressure and relative wafer speed enabling photoresist to be uniformly dispensed onto a passing wafer.

According to another aspect of the invention, reverse pressure is applied to the entry opening after coating a wafer to retract photoresist back into the dispenser. As a result, the photoresist bead does not harden in place.

DESCRIPTION OF THE PREFERRED EMBODIMENT

Figure 1:
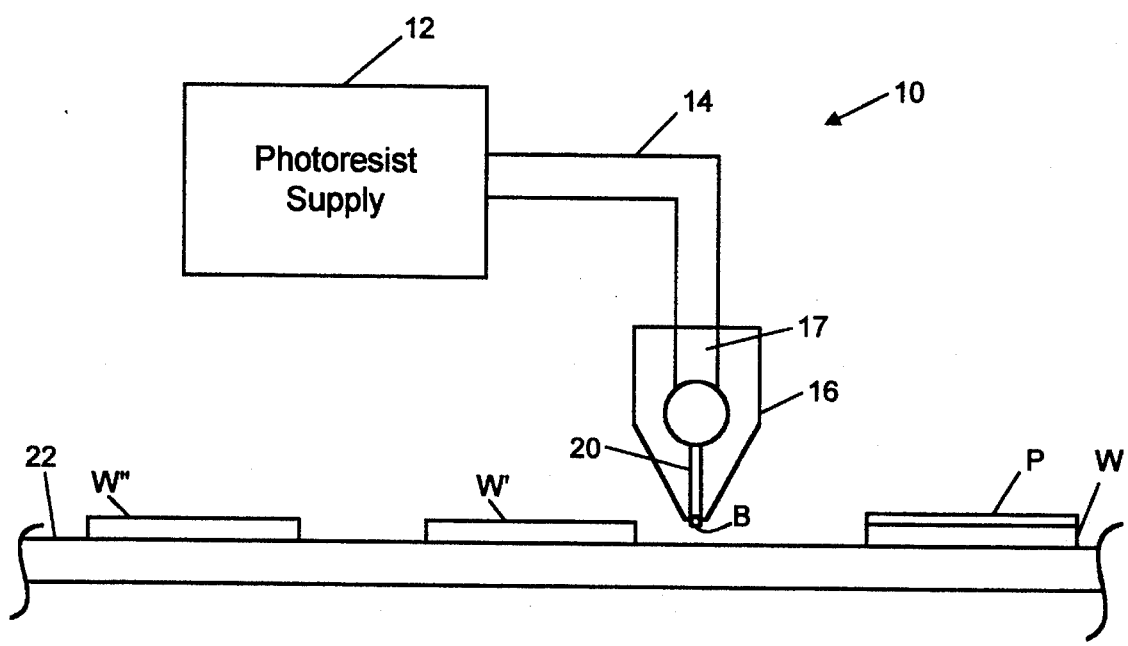
FIG. 1 is a block diagram of the photoresist dispenser apparatus according to an embodiment of this invention.
Figure 3:
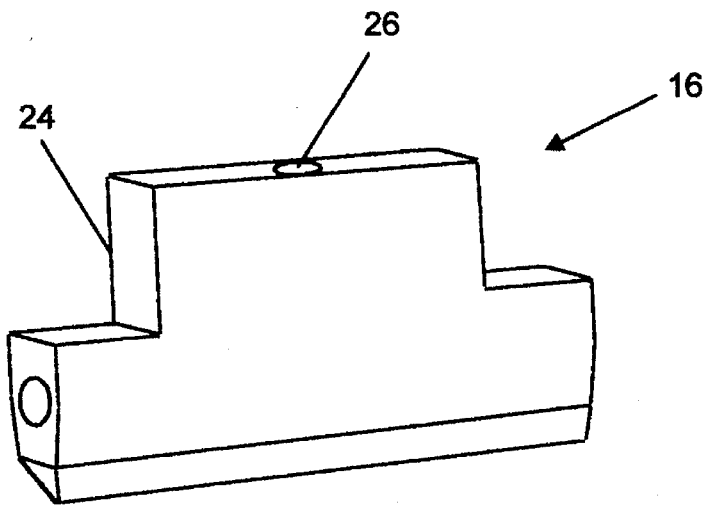
FIG. 3 is an isometric view of the photoresist dispenser of FIG. 1.

FIG. 1 shows a system 10 for dispensing a photoresist layer P of uniform thickness onto a wafer W according to an embodiment of this invention. Photoresist flows under pressure from a supply 12 through tube 14 into the dispenser apparatus 16. The photoresist is received into a reservoir 18 of the dispenser, then flows through an elongated channel 20 to an exit opening where a bead B of photoresist forms. The bead B remains intact due to surface tension and viscous forces of the photoresist. As a wafer W passes under the dispenser and contacts the bead B, the surface tension is broken and the photoresist flows onto the wafer W to form a layer P. By controlling the flow pressure of the photoresist, by appropriately defining the width of the elongated exit opening and by defining an appropriate relative speed between the wafer and dispenser, a photoresist layer P of substantially uniform thickness is achieved.

Figure 2:
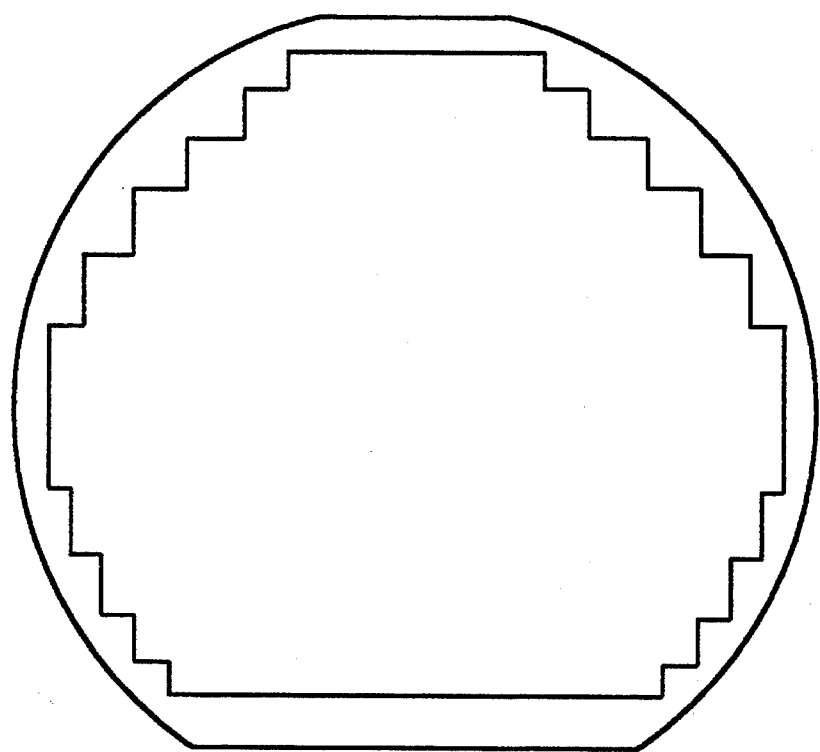
FIG. 2 is a diagram of a conventional wafer surface.
Figure 4:
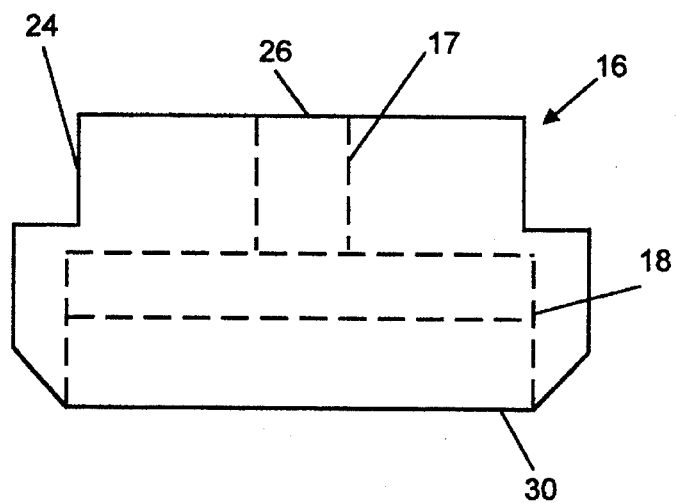
FIG. 4 is a plane view of the dispenser apparatus of FIG. 1.

For a four inch wafer (FIG. 2) the dispenser moves relative to the wafer at approximately 2 mm above the wafer surface so the wafer Just breaks the bead of photoresist hanging at the dispenser opening. The dispenser in one embodiment moves along guide rails, while the wafer is held by a vacuum chuck. The dispenser motion is powered by air pressure or hydraulic pressure to provide an even steady motion parallel to the wafer surface.

The elongated exit opening in one embodiment is 0.075 millimeters wide. The speed of the dispenser relative to the wafer is approximately 4.5 cm/sec. Positive pressure of approximately 4 $gm/cm^2$ (grams per square centimeter) is applied to the dispenser so as to form a bead. Negative pressure of approximately $-7$ $gm/cm^2$ is applied to suck the resist back into the slot between wafers.

FIGS. 3–6 show alternative views of the dispenser apparatus 16. The dispenser apparatus 16 is formed by a housing 24 which has an entry opening 26 at which photoresist is received. The housing 24 may be formed as an integral unit or in components parts. Preferably the housing is formed of a polymer material such as dieldrin acetal polymer, although other materials may be used. Dieldrin acetal polymer is a preferable material based upon its physical stability and easy machinability. In addition, dieldrin acetal polymer is stable against solvents, while soluble in acids.

Figure 5:
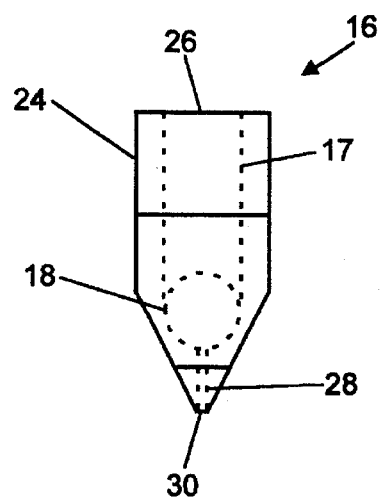
FIG. 5 is another plane view of the dispenser apparatus of FIG. 1.
Figure 6:
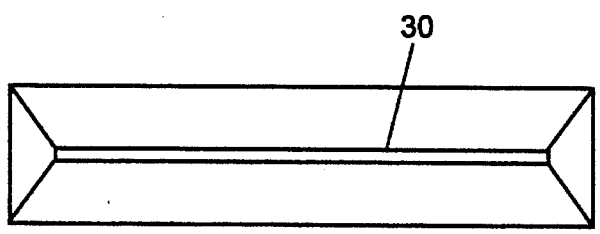
FIG. 6 is another plane view of the dispenser apparatus of FIG. 1.

According to one embodiment the housing defines an exit opening 28 which has an adjustable width. Photoresist flows from the entry opening 26 into a reservoir 18. An elongated channel 28 leads from the reservoir 18 to a straight-edge exit opening 30 at which the photoresist is dispensed. The exit opening 30 is shown in FIG. 5 to have a narrow width and a long length. The length is at least as long as the diameter of a wafer to receive the photoresist coating. The width is defined so as to dispense an appropriate amount of photoresist for a select photoresist pressure and relative wafer speed.

CONCLUSION

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A method for coating a wafer with a uniform layer of photoresist in a single pass without spinning the wafer, the method comprising the steps of:

applying pressure to liquid photoresist having a surface tension, the pressure causing the photoresist to flow through a channel;

flowing the liquid photoresist from the channel between two parallel plates, the two plates defining a straight edge opening having a length and a width;

adjusting the pressure applied to the photoresist so that the photoresist forms an elongated bead along the straight edge opening, the pressure adjusted such that the bead remains intact at the opening due to the surface tension of the photoresist; and passing the wafer relative to the plates at a prescribed relative speed and at a prescribed distance beneath the straight edge opening so that the wafer contacts the bead formed during pressure adjusting step;

wherein the contacting of the bead with the wafer breaks the surface tension of the photoresist causing the photoresist to flow onto the wafer and form a film of the photoresist having substantially uniform thickness.

2. The method of claim 1 in which the width of the opening is approximately 0.075 millimeters, the wafer is passed at a relative speed of approximately 4.5 cm/sec, and a forward pressure of 4 gm/cm$^2$ is applied to the photoresist to form the elongated bead.

3. The method of claim 1 in which the straight edge opening is an exit opening, in which the plates also form an entrance opening, and further comprising the step of sucking photoresist back through into the exit opening after the wafer passes.

4. The method of claim 1, wherein the width of the opening is adjustable, the method further comprising the step of adjusting the width so that the bead remains intact at the opening due to the surface tension of the photoresist until the bead contacts the wafer.

5. The method of claim 1, wherein the wafer has a maximum diameter, and wherein the length of the opening is greater than or equal to the maximum diameter of the wafer.

6. The method of claim 3, wherein the step of sucking photoresist further comprises applying a negative pressure of approximately −7 gm/cm$^2$ to the liquid resist.

* * * * *

UNITED STATES PATENT AND TRADEMARK OFFICE
CERTIFICATE OF CORRECTION

PATENT NO.   : 5,622,747
DATED        : April 22, 1997
INVENTOR(S)  : Todd, Charles N.; Dyson, Frederick It is certified that error appears in the above-identified patent and that said Letters Patent is hereby corrected as shown below:

Col. 2, line 33, delete "Just" and insert --just--.

Signed and Sealed this

Twenty-third Day of December, 1997

Attest:

BRUCE LEHMAN

*Attesting Officer*    *Commissioner of Patents and Trademarks*